(12) United States Patent
Son et al.

(10) Patent No.: US 11,018,198 B2
(45) Date of Patent: May 25, 2021

(54) ELECTROLUMINESCENT DISPLAY DEVICE

(71) Applicant: LG Display Co., Ltd., Seoul (KR)

(72) Inventors: Young-Tae Son, Paju-si (KR);
Jeong-Gyun Shin, Paju-si (KR);
Hyuk-Chan Gee, Paju-si (KR);
Sang-Bin Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 17 days.

(21) Appl. No.: 16/725,132

(22) Filed: Dec. 23, 2019

(65) Prior Publication Data

US 2020/0212128 A1  Jul. 2, 2020

(30) Foreign Application Priority Data

Dec. 26, 2018  (KR) .................. 10-2018-0169708

(51) Int. Cl.
*H01L 27/32* (2006.01)

(52) U.S. Cl.
CPC ...... *H01L 27/3218* (2013.01); *H01L 27/3246* (2013.01)

(58) Field of Classification Search
CPC ............ H01L 27/3218; H01L 27/3246; H01L 27/3244
See application file for complete search history.

(56) References Cited

U.S. PATENT DOCUMENTS

| 2020/0119106 A1* | 4/2020 | Kim | ............. H01L 51/56 |
| 2020/0185470 A1* | 6/2020 | Son | ............. H01L 27/3246 |
| 2020/0185471 A1* | 6/2020 | Lee | ............. H01L 51/5237 |
| 2020/0212128 A1* | 7/2020 | Son | ............. H01L 27/3218 |

* cited by examiner

*Primary Examiner* — Edward Chin
(74) *Attorney, Agent, or Firm* — Polsinelli PC

(57) ABSTRACT

An electroluminescent display device comprises a substrate; a plurality of sub-pixels arranged on the substrate, including sub-pixels with different colors arranged along a first direction and sub-pixels with a same color arranged along a second direction; a light-emitting diode disposed at each sub-pixel and including a first electrode, a light-emitting layer and a second electrode; a bank having an opening corresponding to a sub-pixel row along the second direction and disposed between two adjacent sub-pixels along the first direction; and a control pattern between two adjacent sub-pixels along the second direction, wherein the control pattern includes a first control pattern corresponding to a center portion of the sub-pixel row and a second control pattern spaced apart from the first control pattern along the second direction, and where a first end of each of the first and second control patterns is spaced apart from the bank and has an first surface parallel to or inclined with respect to the second direction, and a slope of the first surface of the second control pattern is larger than a slope of the first surface of the first control pattern.

20 Claims, 15 Drawing Sheets

ELECTROLUMINESCENT DISPLAY DEVICE

CROSS REFERENCE TO RELATED APPLICATION

The present application claims priority from and the benefit under 35 U.S.C § 119(a) of Korean Patent Application No. 10-2018-0169708 filed on Dec. 26, 2018, which is hereby incorporated by reference in its entirety.

BACKGROUND

Field of the Disclosure

The present disclosure relates to an electroluminescent display device, and more particularly, to an electroluminescent display device having a large size and implementing a high definition.

Description of the Background

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green and blue sub-pixels, and displays various color images by allowing the red, green and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask.

However, the evaporation process increases manufacturing costs due to preparation of the mask and has a problem in application to a large-sized and high-definition display device due to manufacturing variations, sagging, shadow effect of the mask, and the like.

SUMMARY

Accordingly, the present disclosure is directed to an electroluminescent display device that substantially obviates one or more of the problems due to limitations and disadvantages of the related art.

More specifically, the present disclosure provides an electroluminescent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate; a plurality of sub-pixels arranged on the substrate along a first direction and a second direction; a light-emitting diode disposed at each sub-pixel and including a first electrode, a light-emitting layer and a second electrode; a bank having an opening corresponding to a sub-pixel row along the second direction and disposed between adjacent sub-pixels along the first direction; and a control pattern between adjacent sub-pixels along the second direction, wherein the control pattern includes a first control pattern corresponding to a center portion of the sub-pixel row and a second control pattern spaced apart from the first control pattern along the second direction, and where a first end of each of the first and second control patterns is spaced apart from the bank and has an inclined surface, and a slope of the inclined surface of the second control pattern is larger than a slope of the inclined surface of the first control pattern.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of the disclosure, illustrate aspects of the present disclosure and together with the description serve to explain the principles of the present disclosure.

In the drawings.

DETAILED DESCRIPTION

Reference will now be made in detail to aspects of the disclosure, examples of which are illustrated in the accompanying drawings.

An electroluminescent display device according to an aspect of the present disclosure has a display area displaying an image and a non-display area surrounding the display area. The display area includes a plurality of pixels, and each of the plurality of pixels includes red, green and blue sub-pixels. A pixel region corresponding to each sub-pixel may have a configuration shown in FIG. 1.

Figure 1:
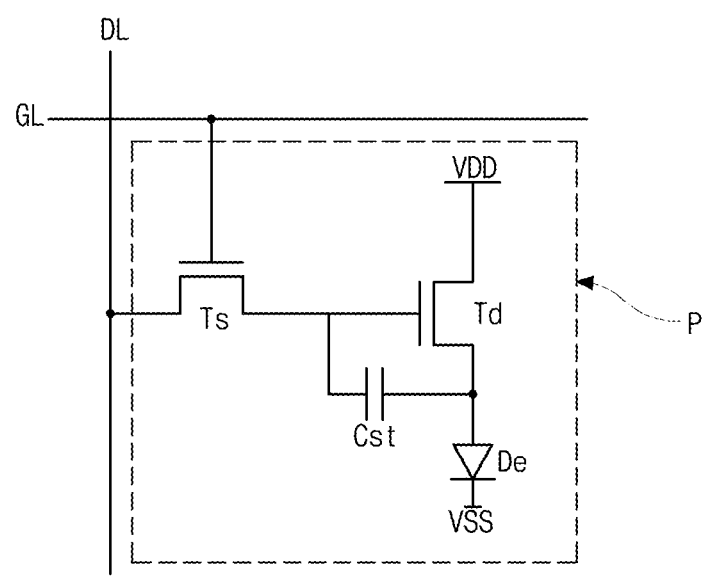
FIG. 1 is a circuit diagram of one pixel region of an electroluminescent display device according to an aspect of the present disclosure.

FIG. 1 is a circuit diagram of one pixel region of an electroluminescent display device according to an aspect of the present disclosure.

In FIG. 1, the electroluminescent display device according to the aspect of the present disclosure includes a gate line DL and a data line DL crossing each other to define a pixel region P. A switching thin film transistor Ts, a driving thin film transistor Td, a storage capacitor Cst, and a light-emitting diode De are formed in the pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more transistors and/or capacitors may be added in the pixel region P in addition to the switching and driving thin film transistors Ts and Td and the storage capacitor Cst.

That is, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change may be further added in the pixel region P. The sensing thin film transistor and/or capacitor may be connected to a reference line for applying a reference voltage and outputting a sensing voltage.

Figure 2:
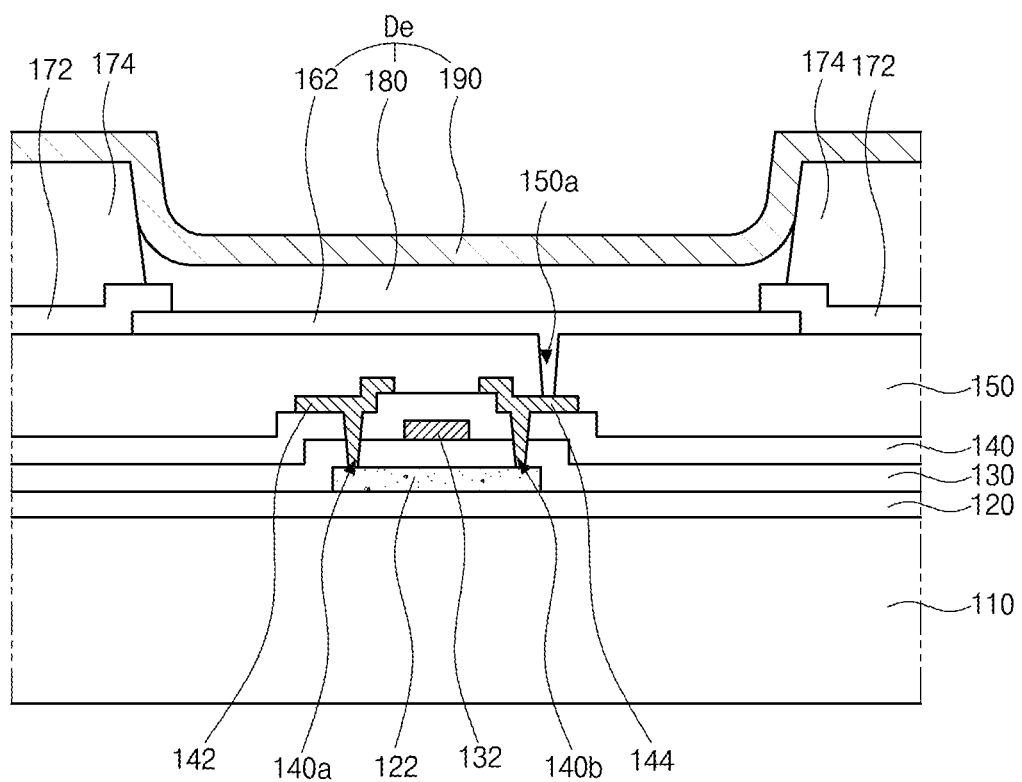
FIG. 2 is a schematic cross-sectional of an electroluminescent display device according to the aspect of the present disclosure.

FIG. 2 is a schematic cross-sectional of an electroluminescent display device according to the aspect of the present disclosure and shows one pixel region.

In FIG. 2, a buffer layer 120 is formed on a substrate 110. The buffer layer 120 is disposed substantially on an entire surface of the substrate 110. The substrate 110 may be a glass substrate or a plastic substrate. For example, polyimide may be used as the plastic substrate. The buffer layer 120 may be formed of an inorganic material, such as silicon oxide ($SiO_2$) or silicon nitride (SiNx), and may be a single layer or multiple layers.

A patterned semiconductor layer 122 is formed on the buffer layer 120. The semiconductor layer 122 may be formed of an oxide semiconductor layer, and a light-shielding pattern (not shown) may be further formed under the semiconductor layer 122. The light-shielding pattern may block light incident on the semiconductor layer 122 and may prevent the semiconductor layer 122 from deteriorating due to the light. Alternatively, the semiconductor layer 122 may be formed of polycrystalline silicon, and both ends of the semiconductor layer 122 may be doped with impurities.

A gate insulating layer 130 of an insulating material is formed on the semiconductor layer 122 substantially over the entire surface of the substrate 110. The gate insulating layer 130 may be formed of an inorganic insulating material such as silicon oxide ($SiO_2$) or silicon nitride (SiNx). When the semiconductor layer 122 is made of an oxide semiconductor material, the gate insulating layer 130 may be formed of silicon oxide ($SiO_2$). Alternatively, when the semiconductor layer 122 is made of polycrystalline silicon, the gate insulating layer 130 may be formed of silicon oxide ($SiO_2$) or silicon nitride (SiNx).

A gate electrode 132 of a conductive material such as metal is formed on the gate insulating layer 130 corresponding to the center of the semiconductor layer 122. In addition, a gate line (not shown) and a first capacitor electrode (not shown) may be formed on the gate insulating layer 130. The gate line extends in a first direction, and the first capacitor electrode is connected to the gate electrode 132.

In the aspect of the present disclosure, the gate insulating layer 130 is formed over the entire surface of the substrate 110. However, the gate insulating layer 130 may be patterned to have the same shape as the gate electrode 132.

An interlayer insulating layer 140 made of an insulating material is formed on the gate electrode 132 substantially over the entire surface of the substrate 110. The interlayer insulating layer 140 may be formed of an inorganic insulating material such as silicon oxide ($SiO_2$) or silicon nitride (SiNx). Alternatively, the interlayer insulating layer 140 may be formed of an organic insulating material such as photo acryl or benzocyclobutene.

The interlayer insulating layer 140 has first and second contact holes 140a and 140b exposing top surfaces of both ends of the semiconductor layer 122. The first and second contact holes 140a and 140b are disposed at both sides of the gate electrode 132 and spaced apart from the gate electrode 132. The first and second contact holes 140a and 140b are also formed in the gate insulating layer 130. Alternatively, when the gate insulating layer 130 is patterned to have the same shape as the gate electrode 132, the first and second contact holes 140a and 140b are formed only in the interlayer insulating layer 140.

Source and drain electrodes 142 and 144 of a conductive material such as metal are formed on the interlayer insulating layer 140. In addition, a data line (not shown), a power supply line (not shown) and a second capacitor electrode (not shown) may be further formed on the interlayer insulating layer 140.

The source and drain electrodes 142 and 144 are spaced apart from each other with the gate electrode 132 positioned therebetween and are in contact with both ends of the semiconductor layer 122 through the first and second contact holes 140a and 140b, respectively. Although not shown in the figure, the data line extends in a second direction and crosses the gate line to thereby define a pixel region. The power supply line for supplying a high voltage is spaced apart from the data line. The second capacitor electrode is connected to the drain electrode 144. The second capacitor electrode overlaps the first capacitor electrode to thereby constitute a storage capacitor with the interlayer insulating layer 140 therebetween as a dielectric. Alternatively, the first capacitor electrode may be connected to the drain electrode 14, and the second capacitor electrode may be connected to the gate electrode 132.

The semiconductor layer 122, the gate electrode 132, and the source and drain electrodes 142 and 144 form a thin film transistor. The thin film transistor has a coplanar structure in which the gate electrode 132 and the source and drain electrodes 142 and 144 are located at the same side with respect to the semiconductor layer 122.

Alternatively, the thin film transistor may have an inverted staggered structure in which the gate electrode and the source and drain electrodes are located at different sides with respect to the semiconductor layer. That is, the gate electrode may be disposed under the semiconductor layer, and the source and drain electrodes may be disposed over the semiconductor layer. The semiconductor layer may be formed of oxide semiconductor or amorphous silicon.

The thin film transistor corresponds to a driving thin film transistor, and a switching thin film transistor (not shown) having the same structure as the driving thin film transistor may be further formed in the pixel region on the substrate 110. The gate electrode 132 of the driving thin film transistor may be connected to a drain electrode (not shown) of the switching thin film transistor, and the source electrode 142 of the driving thin film transistor is connected to the power supply line. In addition, a gate electrode (not shown) and a source electrode (not shown) of the switching thin film transistor may be connected to the gate line and the data line, respectively.

A sensing thin film transistor having the same structure of the driving thin film transistor may be further formed in the pixel region on the substrate 110, but the present disclosure is not limited thereto.

An overcoat layer 150 of an insulating material is formed on the source and drain electrodes 142 and 144 substantially over the entire surface of the substrate 110. The overcoat layer 150 may be formed of an organic insulating material such as photo acryl or benzocyclobutene. The overcoat layer 150 may have a flat top surface.

In the meantime, an insulating layer of an inorganic insulating material such as silicon oxide ($SiO_2$) or silicon nitride (SiNx) may be further formed under the overcoat layer 150.

The overcoat layer 150 has a drain contact hole 150a exposing the drain electrode 144. The drain contact hole 150a may be spaced apart from the second contact hole 140b. Alternatively, the drain contact hole 150a may be disposed right over the second contact hole 140b.

A first electrode 162 is formed on the overcoat layer 150 and formed of a conductive material having a relatively high work function. The first electrode 162 is disposed in the pixel region and is in contact with the drain electrode 144 through the drain contact hole 150a. For example, the first electrode 162 may be formed of a transparent conductive material such as indium tin oxide (ITO) or indium zinc oxide (IZO), but is not limited thereto.

The electroluminescent display device according to the aspect of the present disclosure is a top emission type in which light of a light-emitting diode De is output toward a direction opposite the substrate 110. Accordingly, the first electrode 162 may further include a reflective electrode or a reflective layer formed of a metal material having a relatively high reflectance below the transparent conductive material. For example, the reflective electrode or reflective layer may be formed of an aluminum-palladium-copper (APC) alloy or silver (Ag). The first electrode 162 may have a triple-layer structure of ITO/APC/ITO or ITO/Ag/ITO, but is not limited thereto.

A first bank 172 of an insulating material is formed on the first electrode 162. The first bank 172 overlaps and covers edges of the first electrode 162 and exposes a central portion of the first electrode 162. The first bank 172 has a hydrophilic property. For example, the first bank 172 may be formed of an inorganic insulating material such as silicon oxide ($SiO_2$) or silicon nitride (SiNx). Alternatively, the first bank 172 may be formed of polyimide.

A second bank 174 of an insulating material is formed on the first bank 172. The second bank 172 has a narrower width than the first bank 172, is disposed on the first bank 172, and exposes edges of the first bank 172. The second bank 174 has a hydrophobic property. A thickness of the second bank 174 may be greater than a thickness of the first bank 172. The second bank 174 may be formed of an organic insulating material having a hydrophobic property. Alternatively, the second bank 174 may be formed of an organic insulating material having a hydrophilic property and may be subjected to a hydrophobic treatment.

Meanwhile, only the first bank 172 may be disposed on other edges of the first electrode 162 not shown in the figure. In addition, even if the first and second banks 172 and 174 are formed on the edges of the first electrode 162 in FIG. 2, the first bank 172 may be omitted, and only the second bank 174 may overlap and cover the edges of the first electrode 162.

A light-emitting layer 180 is formed on the first electrode 162 exposed by the first and second banks 172 and 174.

Although not shown in the figure, the light-emitting layer 180 may include a first charge auxiliary layer, a light-emitting material layer, and a second charge auxiliary layer that are sequentially positioned over the first electrode 162. The light-emitting material layer may be formed of any one of red, green and blue luminescent materials, but is not limited thereto. The luminescent material may be an organic luminescent material such as a phosphorescent compound or a fluorescent compound or may be an inorganic luminescent material such as a quantum dot.

The first charge auxiliary layer may be a hole auxiliary layer, and the hole auxiliary layer may include at least one of a hole injecting layer (HIL) and a hole transporting layer (HTL). In addition, the second charge auxiliary layer may be an electron auxiliary layer, and the electron auxiliary layer may include at least one of an electron injecting layer (EIL) and an electron transporting layer (ETL). However, the present disclosure is not limited thereto.

The light-emitting layer 180 is formed through a solution process. Thus, the process may be simplified and a display device with a large size and high resolution may be provided. A spin coating method, an ink jet printing method, or a screen printing method may be used as the solution process, but the present disclosure is not limited thereto. When the solution is dried, a drying speed of a solvent in a region adjacent to the second bank 174 is different from that in other regions. Therefore, a height of the light-emitting layer 180 in the region adjacent to the second bank 174 may rise as it gets closer to the second bank 174.

Meanwhile, among the layers of the light-emitting layer 180, the electron auxiliary layer may be formed through a vacuum evaporation process. At this time, the electron auxiliary layer may be formed substantially over the entire surface of the substrate 110.

A second electrode 190 of a conductive material having a relatively low work function is formed on the light-emitting layer 180 substantially over the entire surface of the substrate 110. The second electrode 190 may be formed of aluminum (Al), magnesium (Mg), silver (Ag), or an alloy thereof. The second electrode 190 has a relatively thin thickness such that light from the light-emitting layer 180 may be transmitted therethrough. Alternatively, the second electrode 190 may be formed of a transparent conductive material such as indium-gallium-oxide (IGO), but is not limited thereto.

The first electrode 162, the light-emitting layer 180 and the second electrode 190 constitute a light-emitting diode De. The first electrode 162 may serve as an anode, and the second electrode 190 may serve as a cathode, but is not limited thereto.

As described above, the electroluminescent display device according to the aspect of the present disclosure may be a top emission type in which light from the light-emitting layer 180 of the light-emitting diode De is output toward a direction opposite the substrate 110, that is, output to the outside through the second electrode 190. The top emission type display device may have a wider emission area than a bottom emission type display device of the same size, to thereby improve luminance and reduce power consumption.

The light-emitting diode De of each pixel region may have an element thickness for a micro-cavity effect corresponding to a wavelength of the emitted light, thereby increasing the light efficiency.

In the meantime, a protective layer and/or an encapsulating layer (not shown) may be formed on the second electrode 190 substantially over the entire surface of the substrate 110 to block moisture or oxygen introduced from the outside, thereby protecting the light-emitting diode De.

<First Aspect>

Figure 3:
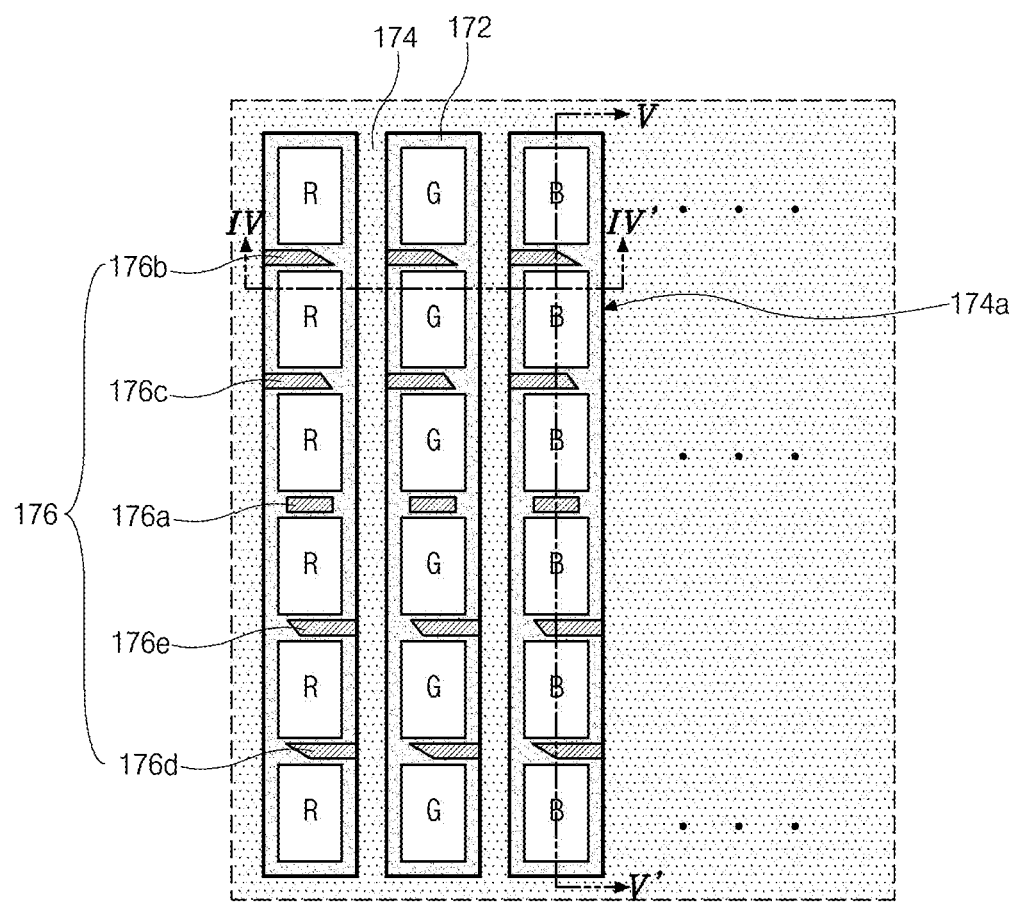
FIG. 3 is a schematic plan view of an electroluminescent display device according to a first aspect of the present disclosure.

FIG. 3 is a schematic plan view of an electroluminescent display device according to a first aspect of the present disclosure and mainly shows a bank configuration.

In FIG. 3, the electroluminescent display device according to the first aspect of the present disclosure includes red, green and blue sub-pixels R, G and B. The red, green and blue sub-pixels R, G and B are sequentially arranged along a first direction, and the same color sub-pixels R, G and B are arranged along a second direction. Here, the red, green and blue sub-pixels R, G and B are shown to each have a rectangular shape, but is not limited thereto. The red, green and blue sub-pixels R, G and B each may have various shapes such as a rectangular shape with rounded corners, an oval shape, or the like.

A first bank 172 is disposed between adjacent same color sub-pixels R, G and B and between adjacent different color sub-pixels R, G and B. Further, the first bank 172 may enclose all the sub-pixels R, G and B.

Alternatively, the first bank 172 may be omitted between the adjacent different color sub-pixels R, G and B. That is, the first bank 172 may be formed between the adjacent sub-pixels R, G and B along the second direction and may extend along the first direction.

A second bank 174 is disposed on the first bank 172. The second bank 174 has an opening 174a corresponding to a same color sub-pixel row and is disposed between adjacent different color sub-pixels R, G and B. At this time, the second bank 174 may have a narrower width than the first bank 172 between adjacent different color sub-pixels R, G and B.

Meanwhile, a control pattern 176, which is a third bank 176, is formed between adjacent sub-pixels R, G and B along the second direction. Namely, the control pattern 176 is formed on the first bank 172 between adjacent same color sub-pixels R, G and B and overlaps the first bank 172.

The control pattern 176 includes first, second, third, fourth and fifth control patterns 176a, 176b, 176c, 176d and 176e. The first control pattern 176a is disposed at a center portion of the same color sub-pixel row, the second control pattern 176b is spaced apart from the first control pattern 176a along the second direction, and the third control pattern 176c is disposed between the first control pattern 176a and the second control pattern 176b. Further, the fourth control pattern 176d is spaced apart from the first control pattern 176a on the opposite side of the second control pattern 176b along the second direction, and the fifth control pattern 176e is disposed between the first control pattern 176a and the fourth control pattern 176d. The first control pattern 176a is disposed between the third control pattern 176c and the fifth control pattern 176e.

Accordingly, the second, third, first, fifth and fourth control patterns 176b, 176c, 176a, 176e and 176d are sequentially arranged along the second direction from top to bottom in the context of the figure.

At least one end of each of the first, second, third, fourth and fifth control patterns 176a, 176b, 176c, 176d and 176e is spaced apart from the second bank 174, and thus the first bank 172 thereunder is exposed between the second bank 174 and the at least one end of each of the first, second, third, fourth and fifth control patterns 176a, 176b, 176c, 176d and 176e. In addition, the at least one end of each of the first, second, third, fourth and fifth control patterns 176a, 176b, 176c, 176d and 176e, which is spaced apart from the second bank 174, has an inclined surface (including a surface inclined with a slope of 0 degree, i.e., parallel surface), and slopes and/or directions of the inclined surfaces are different from each other. This will be described in detail later.

Here, the first bank 172 and the control pattern 176 have a hydrophilic property, and the second bank 174 has a hydrophobic property.

A cross-sectional structure of the electroluminescent display device of the present disclosure will be described with reference to FIG. 4 and FIG. 5.

Figure 4:
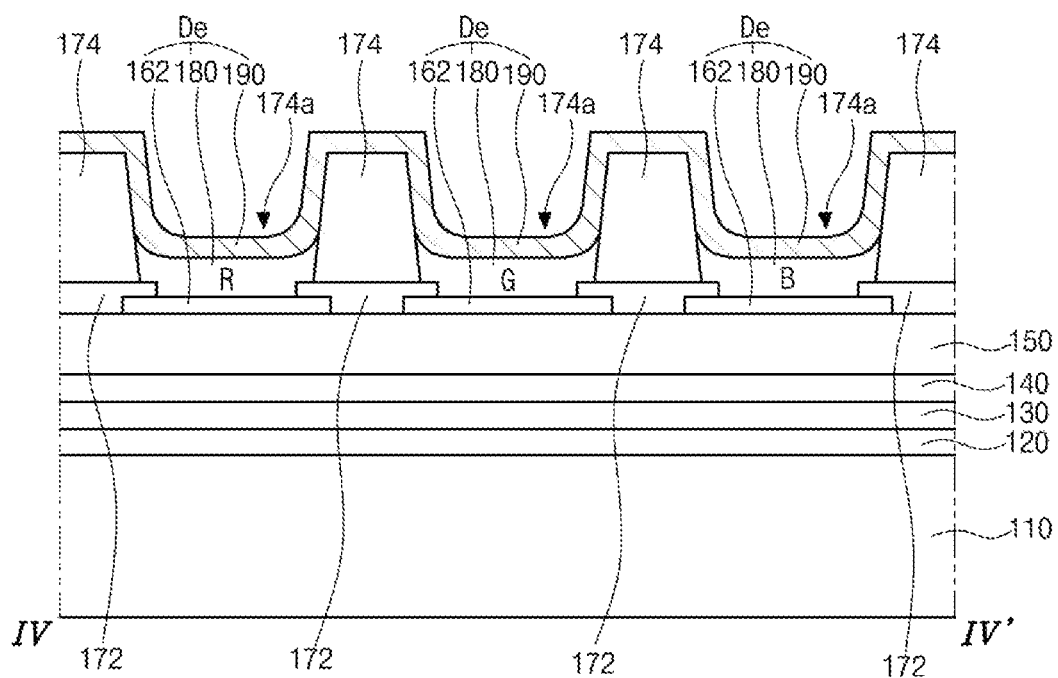
FIG. 4 is a cross-sectional view corresponding to line IV-IV' of FIG. 3.
Figure 5:
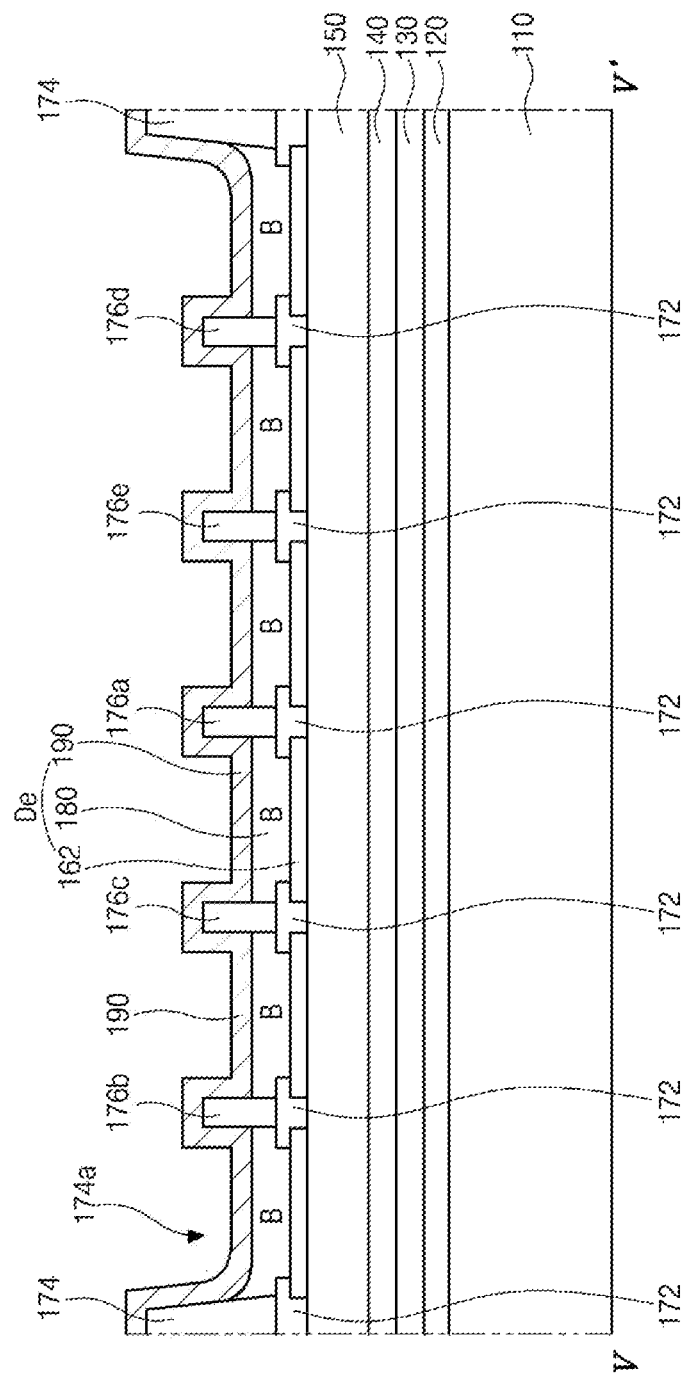
FIG. 5 is a cross-sectional view corresponding to line V-V' of FIG. 3.

FIG. 4 is a cross-sectional view corresponding to the line IV-IV' of FIG. 3, and FIG. 5 is a cross-sectional view corresponding to the line V-V' of FIG. 3.

In FIG. 4 and FIG. 5, a buffer layer 120, a gate insulating layer 130, an interlayer insulating layer 140 and an overcoat layer 150 are sequentially formed on a substrate 110 on which a plurality of pixel regions respectively corresponding to red, green and blue sub-pixels R, G and B are defined. A first electrode 162 is formed in each pixel region on the overcoat layer 150.

Although not shown in the figures, one or more thin film transistors and/or capacitors having the configuration of FIG. 2 may be further formed between the substrate 110 and the overcoat layer 150, and the one or more thin film transistors may be connected to the first electrode 162.

A first bank 172 is formed on the first electrode 162. The first bank 172 overlaps and covers edges of the first electrode 162. The first bank 172 is formed between adjacent same color sub-pixels R, G and B and between adjacent different color sub-pixels R, G and B. Alternatively, the first bank 172 may be omitted between adjacent different color sub-pixels R, G and B and may be disposed only between adjacent same color sub-pixels R, G and B.

The first bank 172 may be formed of a material having a hydrophilic property, for example, an inorganic insulating material such as silicon oxide (SiO2) or silicon nitride (SiNx). Alternatively, the first bank 172 may be formed of polyimide.

In addition, a second bank 174 is formed on the first bank 172. The second bank 174 has a thicker thickness than the first bank 172. The second bank 174 is formed only between adjacent different color sub-pixels R, G and B and is not formed between adjacent same color sub-pixels R, G and B. A width of the second bank 174 is narrower than a width of the first bank 172 between adjacent different color sub-pixels R, G and B.

The second bank 174 has an opening 174a corresponding to a same color sub-pixel row and exposes the first electrode 162 of the same color sub-pixel row through the opening 174a.

Here, when the first bank 172 is omitted between adjacent different color sub-pixels R, G and B, the second bank 174 contacts and overlaps edges of each first electrode 162 of FIG. 4 and covers the edges of each first electrode 162 of FIG. 4.

The second bank 174 may be formed of an organic insulating material having a hydrophobic property. Alternatively, the second bank 174 may be formed of an organic insulating material having a hydrophilic property and may be subjected to a hydrophobic treatment.

The first bank 176 and the second bank 174 may be formed through a half-tone mask process.

Next, a control pattern 176, which is a third bank, is formed on the first bank 172 between adjacent same color sub-pixels R, G and B in the opening 174a of the second bank 174. The control pattern 176 includes first, second, third, fourth and fifth control patterns 176a, 176b, 176c, 176d and 176e. Accordingly, the first, second, third, fourth and fifth control patterns 176a, 176b, 176c, 176d and 176e are exposed through the opening 174a. Each of the first, second, third, fourth and fifth control patterns 176a, 176b, 176c, 176d and 176e has a narrower width than the first bank 172 and has a lower height than the second bank 174.

The first, second, third, fourth and fifth control patterns 176a, 176b, 176c, 176d and 176e may be formed of a material having a hydrophilic property, for example, an inorganic insulating material such as silicon oxide (SiO2) or silicon nitride (SiNx). Alternatively, the first, second, third, fourth and fifth control patterns 176a, 176b, 176c, 176d and 176e may be formed of polyimide. It is beneficial that the first, second, third, fourth and fifth control patterns 176a, 176b, 176c, 176d and 176e are formed of a different material from the first bank 172.

A light-emitting layer 180 is formed on the first electrode 162 exposed through the opening 174a of the second bank 174 in each pixel region. Here, a red light-emitting layer is formed in the red sub-pixel R, a green light-emitting layer is formed in the green sub-pixel G, and a blue light-emitting layer is formed in the blue sub-pixel B.

In addition, although not shown in the figures, the first bank 172, where the control pattern 176 is not disposed, is exposed between adjacent same color sub-pixels R, G and B through the opening 174a of the second bank 174, and the light-emitting layer 180 is also formed on the exposed first bank 172. At this time, the light-emitting layer 180 on the first bank 172 is connected to the light-emitting layer 180 on the first electrode 162 in the pixel region adjacent thereto to thereby form one body.

The light-emitting layer 180 is formed through a solution process. Here, the solutions dropped into respective pixel regions corresponding to the same color sub-pixels, for example, the blue sub-pixel row through different nozzles are connected to each other, and the light-emitting layer 180 is formed by drying the solutions. Accordingly, a deviation in the dropping amounts between the nozzles is minimized, and it is possible to allow thicknesses of the light-emitting layers 180 formed in respective pixel regions uniform. At this time, the light-emitting layer 180 having a more uniform thickness can be formed by controlling a moving speed and moving direction of the solution according to the position through the first, second, third, fourth and fifth control patterns 176a, 176b, 176c, 176d and 176e.

A second electrode 190 is formed on the light-emitting layer 180 and the second bank 174. At this time, the second electrode 190 is also formed on a top surface and a side surface of the control pattern 176, and the second electrode 190 contacts the top surface and the side surface of the control pattern 176.

The first electrode 162, the light-emitting layer 180 and the second electrode 190 constitute a light-emitting diode De.

As described above, in the electroluminescent display device according to the first aspect of the present disclosure, the light-emitting layers 180 of the same color sub-pixels R, G and B are connected to each other and formed as one body, thereby minimizing the deviation in the dropping amount between nozzles and uniformly forming the thicknesses of the light-emitting layers 180 of respective sub-pixels R, G and B. Therefore, the mura is prevented, thereby effectively preventing the image quality of the display device from being lowered.

Further, the control pattern 176 having the hydrophilic property is formed on the first bank 172, and it is possible to allow thicknesses of the light-emitting layers 180 to be formed more uniform by controlling the moving speed and moving direction of the solution.

Meanwhile, the red, green and blue light-emitting layers 180 respectively formed in the red, green and blue sub-pixels R, G and B may have different thicknesses, and in this case, the control patterns 176 respectively corresponding to the red, green and blue sub-pixel rows may also have different heights. For example, when the thickness of the green light-emitting layer 180 is smaller than the thickness of the red light-emitting layer 180 and larger than the thickness of the blue light-emitting layer 180, the height of the control pattern 176 corresponding to the green sub-pixel row may be smaller than the height of the control pattern 176 corresponding to the red sub-pixel row and larger than the height of the control pattern 176 corresponding to the blue sub-pixel row.

The control pattern of an electroluminescent display device according to the first aspect of the present disclosure will be described in detail with reference to FIGS. 6 to 9.

Figure 6:
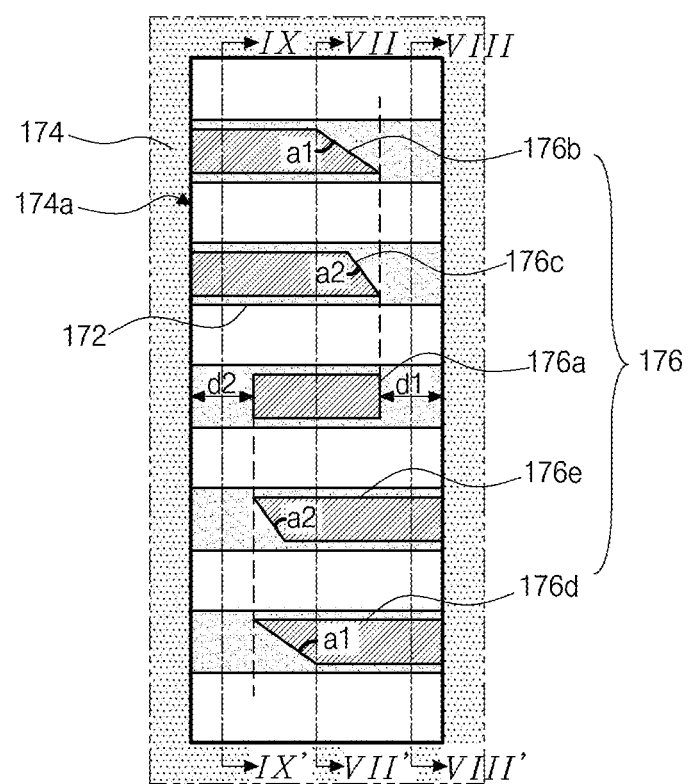
FIG. 6 is a plan view schematically illustrating a bank structure of an electroluminescent display device according to the first aspect of the present disclosure.
Figure 7:
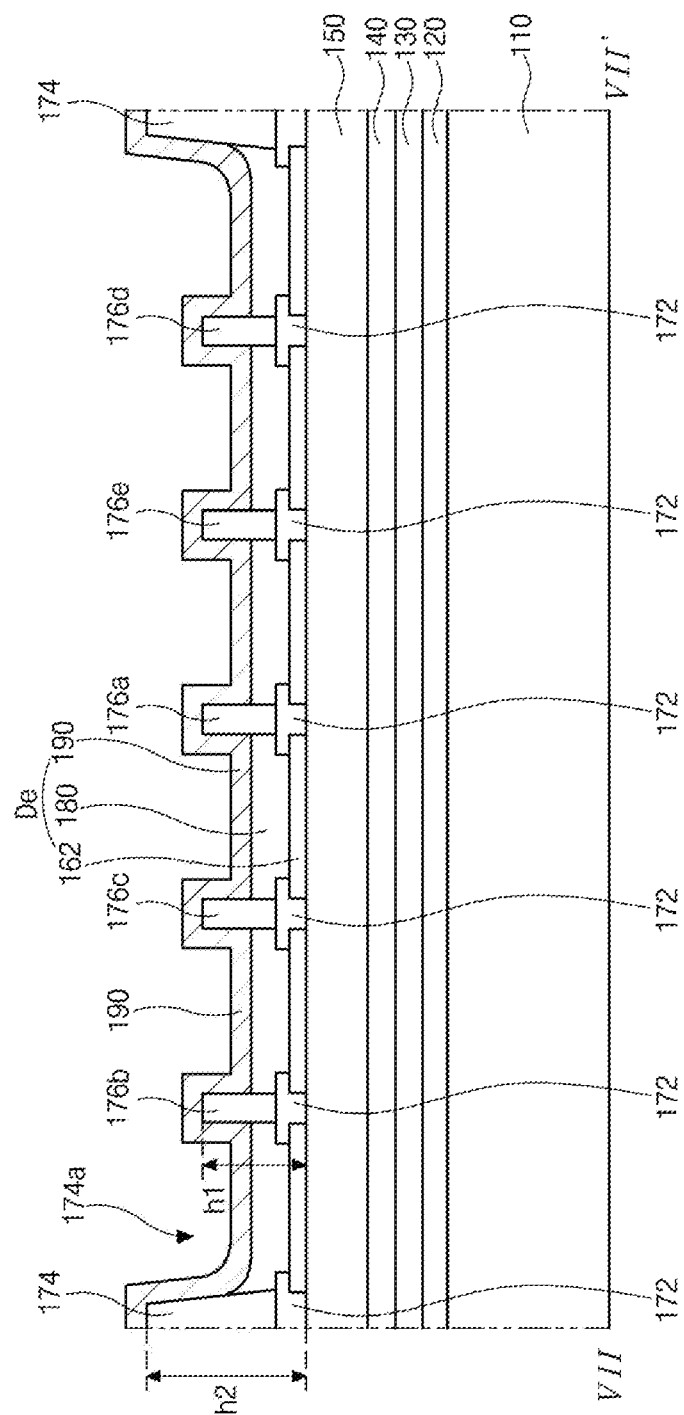
FIG. 7 is a cross-sectional view corresponding to line VII-VII' of FIG. 6.
Figure 8:
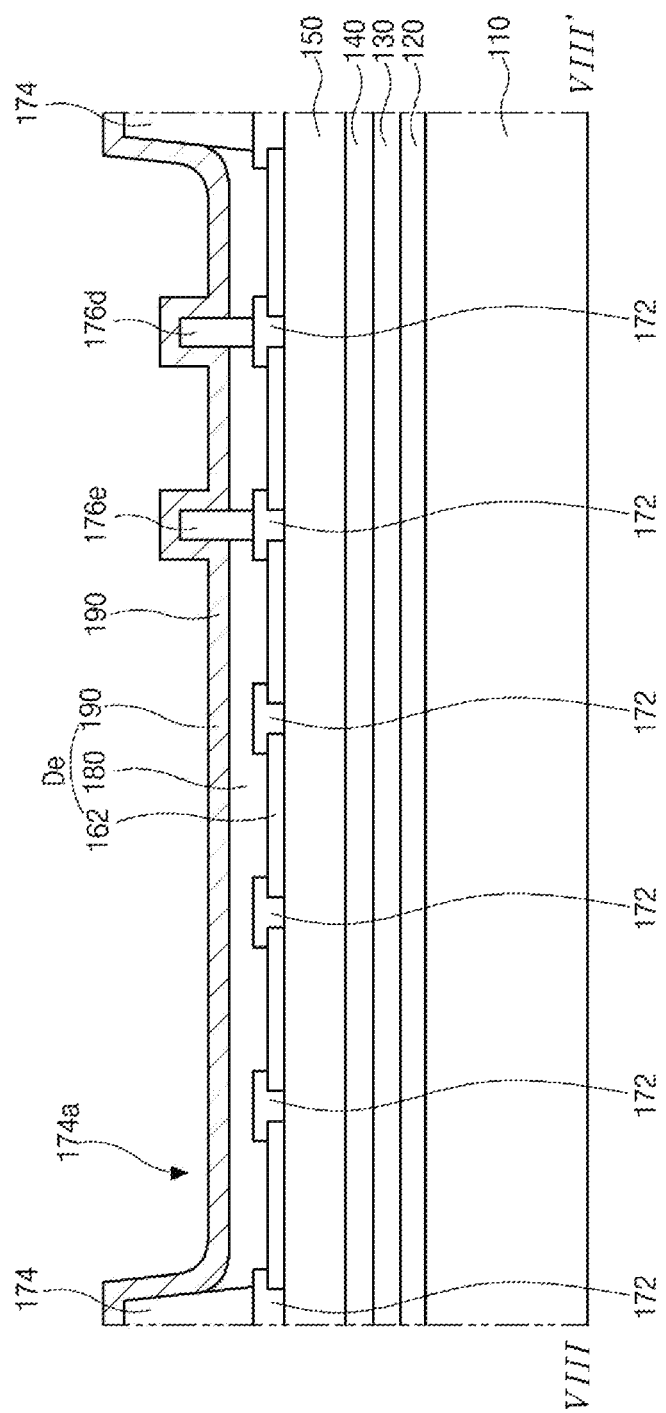
FIG. 8 is a cross-sectional view corresponding to line VIII-VIII' of FIG. 6.
Figure 9:
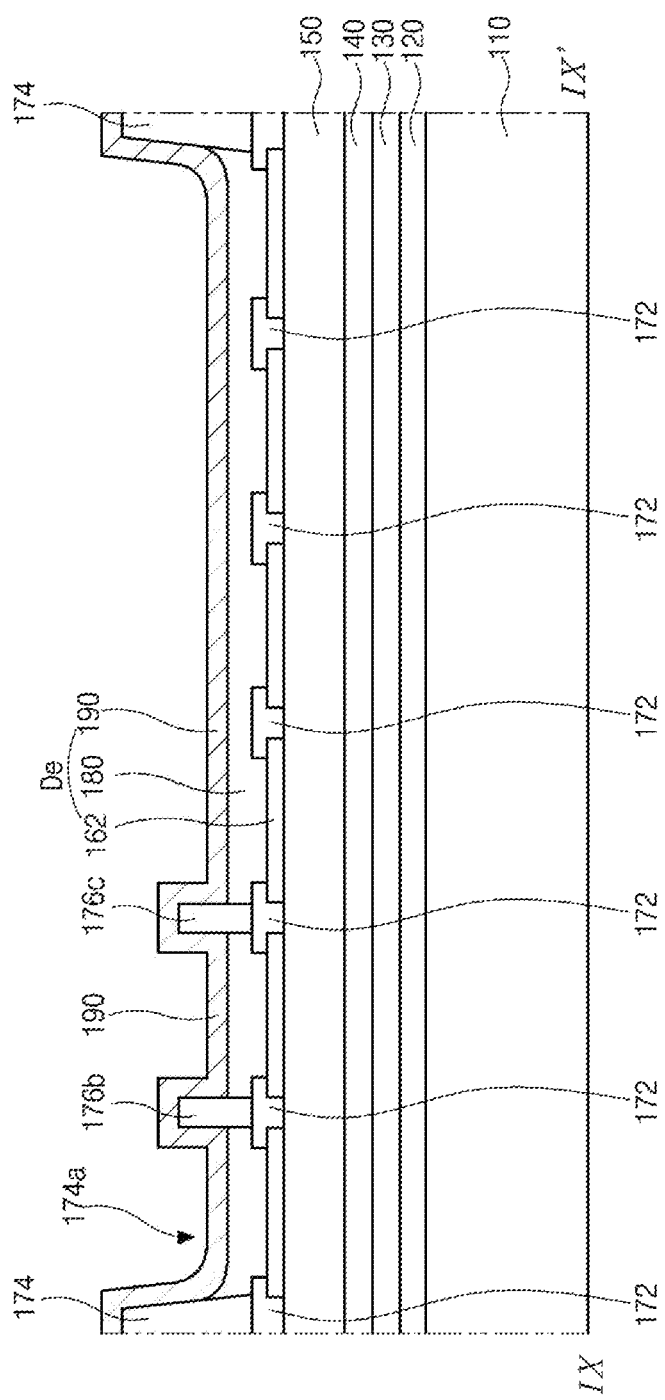
FIG. 9 is a cross-sectional view corresponding to line IX-IX' of FIG. 6.

FIG. 6 is a plan view schematically illustrating a bank structure of an electroluminescent display device according to the first aspect of the present disclosure, FIG. 7 is a cross-sectional view corresponding to the line VII-VII' of FIG. 6, FIG. 8 is a cross-sectional view corresponding to the line VIII-VIII' of FIG. 6, and FIG. 9 is a cross-sectional view corresponding to the line IX-IX' of FIG. 6. For convenience of illustration, in FIG. 6, each pixel region is shown as having a length of a first direction, that is, a horizontal direction larger than a length of a second direction, that is, a vertical direction, but is not limited thereto. Further, in FIG. 6, a first bank is shown as being formed only between adjacent same color sub-pixels, and the first bank is also formed under a second bank.

In FIGS. 6 to 9, a buffer layer 120, a gate insulating layer 130, an interlayer insulating layer 140 and an overcoat layer 150 are sequentially formed on a substrate 110 on which a plurality of pixel regions respectively corresponding to red, green and blue sub-pixels are defined. A first electrode 162 is formed in each pixel region on the overcoat layer 150.

A first bank 172 is formed on the first electrode 162. The first bank 172 has a hydrophilic property. The first bank 172 overlaps and covers edges of the first electrode 162.

A second bank 174 is formed on the first bank 172. The second bank 174 has a hydrophobic property and has a thicker thickness than the first bank 172. The second bank 174 has an opening 174a corresponding to a same color sub-pixel row and exposes the first electrodes 162 of the same color sub-pixel row through the opening 174a.

Further, a control pattern 176 is formed in the opening 174a of the second bank 174. The control pattern has a hydrophilic property and is disposed on the first bank 172 between adjacent same color sub-pixels. A height h1 of the control pattern 176 is lower than a height h2 of the second bank 174 with respect to the overcoat layer 150. Here, it is desirable that the height h1 of the control pattern 176 is equal to or greater than ⅓ and equal to or less than ⅔ of the height h2 of the second bank 174. In addition, the control pattern 176 has a narrower width than the first bank 172.

The control pattern 176 includes first, second, third, fourth and fifth control patterns 176a, 176b, 176c, 176d and 176e. The first control pattern 176a is disposed at a center portion of the same color sub-pixel row, the second control pattern 176b is spaced apart from the first control pattern 176a along the second direction, and the third control pattern 176c is disposed between the first control pattern 176a and the second control pattern 176b. Further, the fourth control pattern 176d is spaced apart from the first control pattern 176a on the opposite side of the second control pattern 176b along the second direction, and the fifth control pattern 176e is disposed between the first control pattern 176a and the fourth control pattern 176d. The first control pattern 176a is disposed between the third control pattern 176c and the fifth control pattern 176e.

Accordingly, the second, third, first, fifth and fourth control patterns 176b, 176c, 176a, 176e and 176d are sequentially arranged along the second direction from top to bottom in the context of the figure.

At least one end of each of the first, second, third, fourth and fifth control patterns 176a, 176b, 176c, 176d and 176e is spaced apart from the second bank 174, and thus the first bank 172 thereunder is exposed between the second bank 174 and the at least one end of each of the first, second, third, fourth and fifth control patterns 176a, 176b, 176c, 176d and 176e. In addition, the at least one end of each of the first, second, third, fourth and fifth control patterns 176a, 176b, 176c, 176d and 176e, which is spaced apart from the second bank 174, has a surface parallel to or inclined with respect to the second direction.

Namely, first and second ends of the first control pattern 176a are spaced apart from the second bank 174 by first and second distances d1 and d2, respectively. First ends of the second and third control patterns 176b and 176c are spaced apart from the second bank 174 by the first distance d1, and second ends of the second and third control patterns 176b and 176c are in contact with the second bank 174. First ends of the fourth and fifth control patterns 176d and 176e are in contact with the second bank 174, and second ends of the fourth and fifth control patterns 176d and 176e are spaced apart from the second bank 174 by the second distance d1. At this time, each of the first and second distances d1 and d2 may be about ¼ of a width of the opening 174a, i.e., about ¼ of a width of each sub-pixel along the first direction.

Here, the first end of each of the second and third control patterns 176b and 176c has an inclined surface, and an inclination angle a1 of the inclined surface of the second control pattern 176b with respect to a line parallel to the second direction is larger than an inclination angle a2 of the inclined surface of the third control pattern 176c. In addition, the second end of each of the fourth and fifth control patterns 176d and 176e has an inclined surface, and the inclination angle a1 of the inclined surface of the fourth control pattern 176d with respect to a line parallel to the second direction is larger than the inclination angle a2 of the inclined surface of the fifth control pattern 176e. Accordingly, a slope of the inclined surface of the second control pattern 176b may be larger than a slope of the inclined surface of the third control pattern 176c, and a slope of the inclined surface of the fourth control pattern 176d may be larger than a slope of the inclined surface of the fifth control pattern 176e.

At this time, the inclined surfaces of the second control pattern 176*b* and the fourth control pattern 176*d* may have the same inclination angle a1, and the inclined surfaces of the third control pattern 176*c* and the fifth control pattern 176*e* may have the same inclination angle a2. That is, the inclined surfaces of the second control pattern 176*b* and the fourth control pattern 176*d* may have the same slope, and the inclined surfaces of the third control pattern 176*c* and the fifth control pattern 176*e* may have the same slope.

Meanwhile, each of the first and second ends of the first control pattern 176*a* has a substantially inclined surfaces with an inclination angle of 0 with respect to a line parallel to the second direction, and a slope of the inclined surface thereof is also 0.

Accordingly, the inclination angle a2 of the first end of the third control pattern 176*c* is larger than the inclination angle of the first end of the first control pattern 176*a* and smaller than the inclination angle a1 of the first end of the second control pattern 176*b*. That is, the slope of the inclined surface of the third control pattern 176*c* is larger than the slope of the inclined surface of the first control pattern 176*a* and smaller than the slope of the inclined surface of the second control pattern 176*b*. Further, the inclination angle a2 of the second end of the fifth control pattern 176*e* is larger than the inclination angle of the second end of the first control pattern 176*a* and smaller than the inclination angle a1 of the second end of the fourth control pattern 176*d*. That is, the slope of the inclined surface of the fifth control pattern 176*e* is larger than the slope of the inclined surface of the first control pattern 176*a* and smaller than the slope of the inclined surface of the fourth control pattern 176*d*.

The second and third control patterns 176*b* and 176*c* and the fourth and fifth control patterns 176*d* and 176*e* have different inclination directions, i.e., directions which the inclined surfaces face. Namely, the inclined surfaces of the second and third control patterns 176*b* and 176*c* face the opposite side of the first control pattern 176*a*, and the inclined surfaces of the fourth and fifth control patterns 176*d* and 176*e* also face the opposite side of the first control pattern 176*a*.

The inclined surfaces of the first, second, third, fourth and fifth control patterns 176*a*, 176*b*, 176*c*, 176*d* and 176*e* adjust a moving speed and moving direction of a solution. At this time, the solution moves from the side which the inclined surface faces to the opposite side thereto, and the moving speed of the solution becomes faster as the slope of the inclined surface gets larger.

Figure 10:
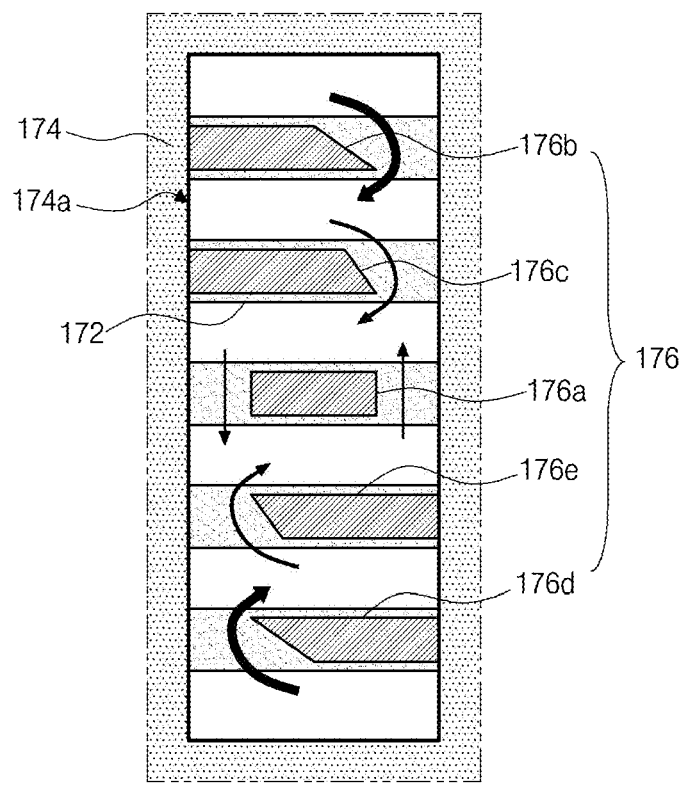
FIG. 10 is a plan view schematically illustrating a moving speed and moving direction of a solution in an electroluminescent display device according to the first aspect of the present disclosure.

The moving speed and moving direction of the solution will be described with reference to FIG. 10 and FIG. 11. FIG. 10 is a plan view schematically illustrating a moving speed and moving direction of a solution in an electroluminescent display device according to the first aspect of the present disclosure, and FIG. 11 is a cross-sectional view schematically illustrating a moving speed and moving direction of a solution in an electroluminescent display device according to the first aspect of the present disclosure.

Figure 11:
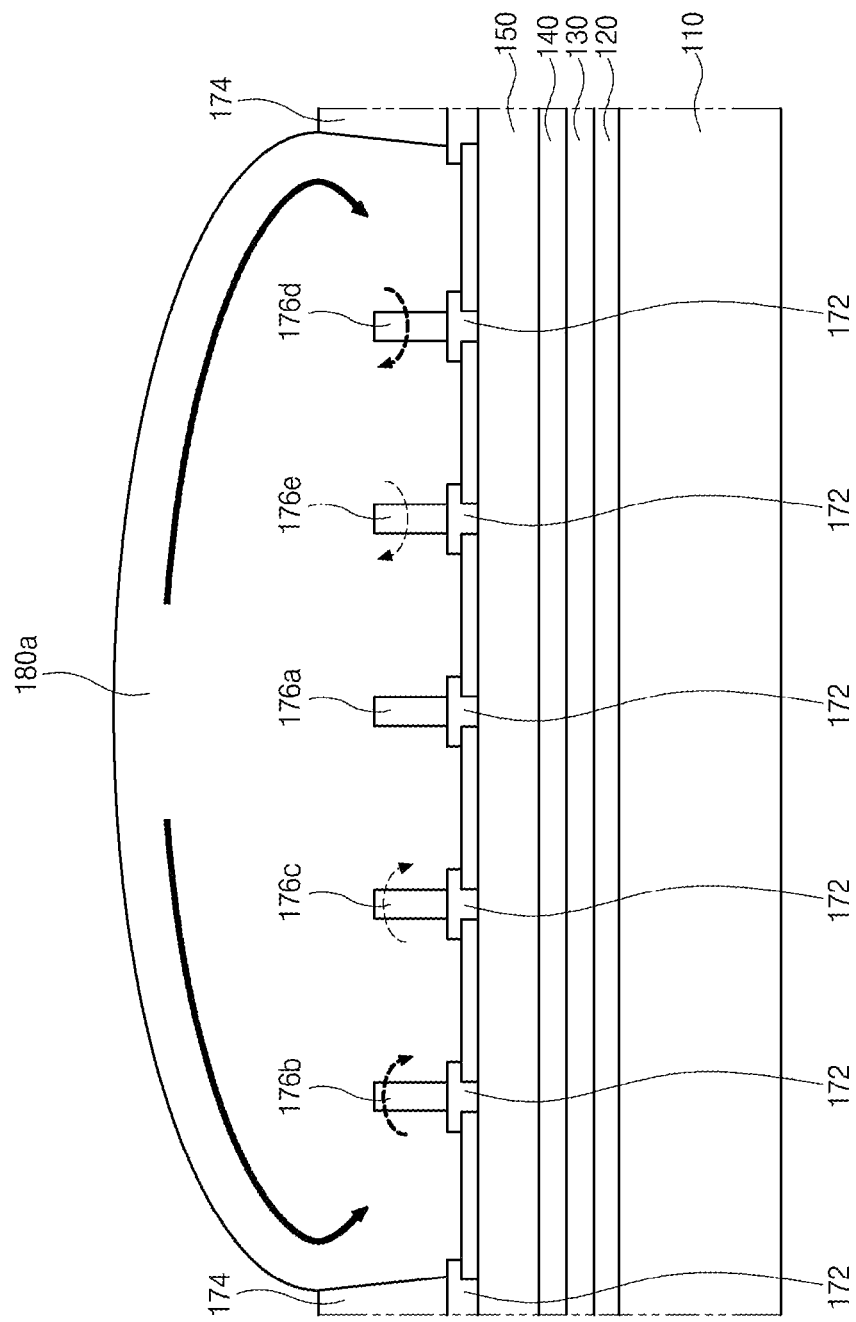
FIG. 11 is a cross-sectional view schematically illustrating a moving speed and moving direction of a solution in an electroluminescent display device according to the first aspect of the present disclosure.

In FIG. 10 and FIG. 11, a solution layer 180*a* is formed by dropping a luminescent solution using an injection apparatus including a plurality of nozzles on a substrate 110 including first and second banks 172 and 174 and first, second, third, fourth and fifth control patterns 176*a*, 176*b*, 176*c*, 176*d* and 176*e*.

Then, a solvent in the solution layer 180*a* is removed by drying the solution layer 180. For example, the solvent in the solution layer 180*a* may be evaporated by performing a vacuum dry process. At this time, convection of the solution occurs due to a difference between the drying speed at an end portion of the sub-pixel row adjacent to the second bank 174, that is, the evaporation speed of the solvent, and the drying speed at a center portion of the sub-pixel row. More specifically, since the drying speed at the end portion of the sub-pixel row adjacent to the second bank is faster than the drying speed at the center portion of the sub-pixel row, the solution moves from the center portion of the sub-pixel row to the end portion of the sub-pixel row, i.e., toward the second bank 174 in the upper part of the solution layer 180*a*. In this case, the amount of the solid deposited at the end portion of the sub-pixel row adjacent to the second bank 174 increases. The height of the light-emitting layer in the region adjacent to the second bank 174 is higher than that in other regions, and this causes a non-uniform thickness of the light-emitting layer. Therefore, it is necessary to rapidly move the solution at the end portion of the sub-pixel row toward the center portion of the sub-pixel row.

To do this, in the first aspect of the present disclosure, the moving speed and moving direction of the solution by forming the first, second, third, fourth and fifth control patterns 176*a*, 176*b*, 176*c*, 176*d* and 176*e* having the inclined surfaces with different slopes and inclination directions.

At this time, the solution moves from the direction which the inclined surface faces to the opposite direction thereto, and the solution moves from the end portion of the sub-pixel row to the center portion of the sub-pixel row because the inclined surfaces of the second and third control patterns 176*b* and 176*c* and the inclined surfaces of the fourth and fifth control patterns 176*d* and 176*e* face the end portions of the sub-pixel row. Further, since the moving speed of the solution becomes faster as the slope of the inclined surface gets larger, the moving speed of the solution around the second and fourth control patterns 176*b* and 176*d* having the largest slope of the inclined surface is faster than the moving speed of the solution around the third and fifth control patterns 176*c* and 176*e* having the relatively small slope of the inclined surface.

Therefore, the solution, which flows from the center portion of the sub-pixel row to the end portion of the sub-pixel row in the upper part of the solution layer 180*a*, moves with a gradually decreased speed from the end portion of the sub-pixel row to the center portion of the sub-pixel row in the upper part of the solution layer 180*a*.

Accordingly, the light-emitting layer having a more uniform thickness can be formed at the center portion and the end portion of the sub-pixel row.

In the meantime, to effectively induce the movement of the solution, it is desirable that the solvent includes a main solvent and a sub solvent and the boiling point of the sub solvent is higher than the boiling point of the main solvent.

Referring to FIGS. 6 to 9 again, the light-emitting layer 180 is formed on each first electrode 162 exposed through the opening 174*a* of the second bank 174. The light-emitting layer 180 has a uniform thickness with respect to the sub-pixel row by controlling the moving speed and moving direction of the solution using the first, second, third, fourth and fifth control patterns 176*a*, 176*b*, 176*c*, 176*d* and 176*e*. At this time, the light-emitting layer 180 may also be formed on the first bank 172, and the light-emitting layer 180 on the first bank 172 is connected to the light-emitting layer 180 on the first electrode 162 adjacent thereto and formed as one body.

Alternatively, when the light-emitting layer 180 has a relatively thin thickness, the height of the light-emitting layer 180 may be lower than the height of the first bank 172 with respect to the overcoat layer 150. In this case, the light-emitting layer 180 may be formed only between adjacent first banks 172, and the light-emitting layers 180 on adjacent first electrodes 162 may be separated from each other.

A second electrode 190 is formed on the light-emitting layer 180. The second electrode 190 is formed substantially over the entire surface of the substrate 110 and also formed on the first, second, third, fourth and fifth control patterns 176a, 176b, 176c, 176d and 176e.

In the first aspect of the present disclosure, five control patterns 176a, 176b, 176c, 176d and 176e are formed to correspond to six sub-pixels, but the present disclosure is not limited thereto. A plurality of sub-pixels may be disposed between adjacent control patterns 176a, 176b, 176c, 176d and 176e, and a control pattern having another slope of an inclined surface may be further formed between adjacent sub-pixels. At this time, the slope of the inclined surface becomes smaller from the end portion of the sub-pixel row to the center portion of the sub-pixel row.

As described above, in the electroluminescent display device according to the first aspect of the present disclosure, it is possible to uniformly form the thickness of the light-emitting layer 180 by forming the control patterns 176a, 176b, 176c, 176d and 176e having the hydrophilic property on the first bank 172 and controlling the moving speed and moving direction of the solution.

Here, the first bank 172 may be omitted. Such a bank structure of an electroluminescent display device is shown in FIG. 12.

Figure 12:
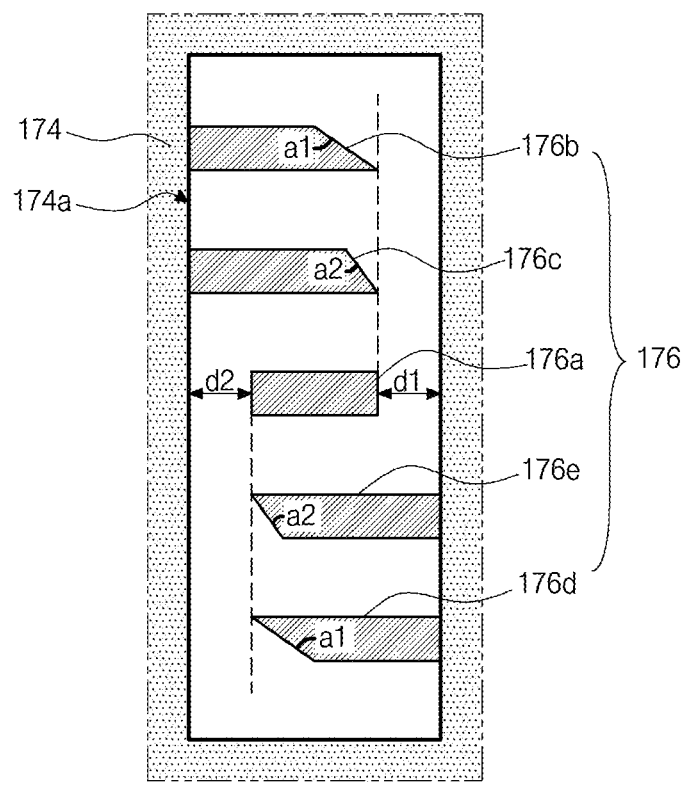
FIG. 12 is a plan view schematically illustrating a bank structure of an electroluminescent display device of another example according to the first aspect of the present disclosure.

As shown in FIG. 12, in the electroluminescent display device of another example according the first aspect of the present disclosure, the first bank 172 of FIG. 4 may be omitted, and only the first, second, third, fourth and fifth control patterns 176a, 176b, 176c, 176d and 176e may be formed in the opening 174a of the second bank 174.

In the meantime, the first, second, third, fourth and fifth control patterns 176a, 176b, 176c, 176d and 176e according to the first aspect of the present disclosure may be applied in a case where the height of the light-emitting layer increases from the center portion of the sub-pixel row to the end portion of the sub-pixel. The position where the height of the light-emitting layer increases may vary depending on the concentration or volume of the solution.

<Second Aspect>

Figure 13:
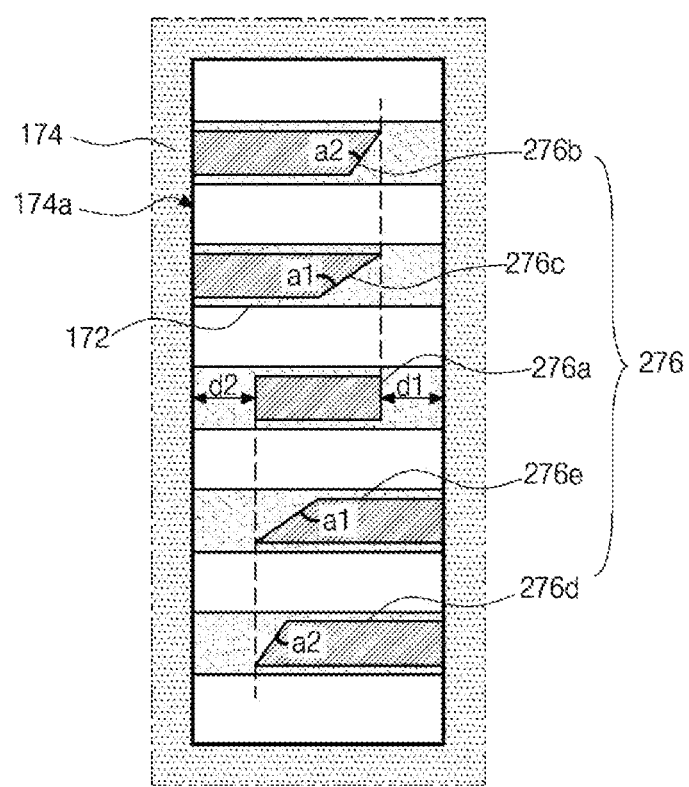
FIG. 13 is a plan view schematically illustrating a bank structure of an electroluminescent display device according to a second aspect of the present disclosure.

FIG. 13 is a plan view schematically illustrating a bank structure of an electroluminescent display device according to a second aspect of the present disclosure. The electroluminescent display device of the second aspect has the same structure as that of the first aspect except for a control pattern. The same parts will be designated by the same references, and descriptions of the same parts will be omitted or will be brief.

In FIG. 13, a first bank 172 extends along a first direction and is disposed between adjacent same color sub-pixels, and a second bank 174 is formed to have an opening 174a corresponding to a same color sub-pixel row.

In addition, a control pattern 276, which is a third bank, is formed between adjacent same color sub-pixels. The control pattern 276 is disposed on the first bank 172 and overlaps the first bank 172.

The control pattern 276 includes first, second, third, fourth and fifth control patterns 276a, 276b, 276c, 276d and 276e. The first control pattern 276a is disposed at a center portion of the same color sub-pixel row, the second control pattern 276b is spaced apart from the first control pattern 276a along a second direction, and the third control pattern 276c is disposed between the first control pattern 276a and the second control pattern 276b. Further, the fourth control pattern 276d is spaced apart from the first control pattern 276a on the opposite side of the second control pattern 276b along the second direction, and the fifth control pattern 276e is disposed between the first control pattern 276a and the fourth control pattern 276d. The first control pattern 276a is disposed between the third control pattern 276c and the fifth control pattern 276e.

At least one end of each of the first, second, third, fourth and fifth control patterns 276a, 276b, 276c, 276d and 276e is spaced apart from the second bank 174, and thus the first bank 172 thereunder is exposed between the second bank 174 and the at least one end of each of the first, second, third, fourth and fifth control patterns 276a, 276b, 276c, 276d and 276e. In addition, the at least one end of each of the first, second, third, fourth and fifth control patterns 276a, 276b, 276c, 276d and 276e, which is spaced apart from the second bank 174, has an inclined surface.

Namely, first and second ends of the first control pattern 276a are spaced apart from the second bank 174 by first and second distances d1 and d2, respectively. First ends of the second and third control patterns 276b and 276c are spaced apart from the second bank 174 by the first distance d1, and second ends of the second and third control patterns 276b and 276c are in contact with the second bank 174. First ends of the fourth and fifth control patterns 276d and 276e are in contact with the second bank 174, and second ends of the fourth and fifth control patterns 276d and 276e are spaced apart from the second bank 174 by the second distance d1. At this time, each of the first and second distances d1 and d2 may be about ¼ of a width of the opening 174a, i.e., about ¼ of a width of each sub-pixel along the first direction.

Here, the first end of each of the second and third control patterns 276b and 276c has an inclined surface, and an inclination angle a2 of the inclined surface of the second control pattern 276b with respect to a line parallel to the second direction is smaller than an inclination angle a1 of the inclined surface of the third control pattern 276c. In addition, the second end of each of the fourth and fifth control patterns 276d and 276e has an inclined surface, and the inclination angle a2 of the inclined surface of the fourth control pattern 276d with respect to a line parallel to the second direction is smaller than the inclination angle a1 of the inclined surface of the fifth control pattern 276e. Accordingly, a slope of the inclined surface of the second control pattern 276b may be smaller than a slope of the inclined surface of the third control pattern 276c, and a slope of the inclined surface of the fourth control pattern 276d may be smaller than a slope of the inclined surface of the fifth control pattern 276e.

At this time, the inclined surfaces of the second control pattern 276b and the fourth control pattern 276d may have the same inclination angle a2, and the inclined surfaces of the third control pattern 276c and the fifth control pattern 276e may have the same inclination angle a1. That is, the inclined surfaces of the second control pattern 276b and the fourth control pattern 276d may have the same slope, and the inclined surfaces of the third control pattern 276c and the fifth control pattern 276e may have the same slope.

Meanwhile, each of the first and second ends of the first control pattern 276a has a substantially inclined surfaces with an inclination angle of 0 with respect to a line parallel to the second direction, and a slope of the inclined surface thereof is also 0.

Accordingly, the inclination angle a2 of the first end of the second control pattern 276b is larger than the inclination angle of the first end of the first control pattern 276a and smaller than the inclination angle a1 of the first end of the third control pattern 276c. That is, the slope of the inclined surface of the second control pattern 276b is larger than the slope of the inclined surface of the first control pattern 276a and smaller than the slope of the inclined surface of the third control pattern 276c. Further, the inclination angle a2 of the second end of the fourth control pattern 276d is larger than the inclination angle of the second end of the first control pattern 276a and smaller than the inclination angle a1 of the second end of the fifth control pattern 276e. That is, the slope of the inclined surface of the fourth control pattern 276d is larger than the slope of the inclined surface of the first control pattern 276a and smaller than the slope of the inclined surface of the fifth control pattern 276e.

The inclined surfaces of the second and third control patterns 276b and 276c face the first control pattern 276a, and the inclined surfaces of the fourth and fifth control patterns 276d and 276e also face the first control pattern 276a. Thus, the inclined surfaces of the second and third control patterns 276b and 276c and the inclined surfaces of the fourth and fifth control patterns 276d and 276e face each other.

The inclined surfaces of the first, second, third, fourth and fifth control patterns 276a, 276b, 276c, 276d and 276e adjust a moving speed and moving direction of a solution. At this time, the solution moves from the side which the inclined surface faces to the opposite side thereto, and the moving speed of the solution becomes faster as the slope of the inclined surface gets larger.

The solution moves from a center portion of the sub-pixel row to an end portion of the sub-pixel row because the inclined surfaces of the second and third control patterns 276b and 276c and the inclined surfaces of the fourth and fifth control patterns 276d and 276e face the first control pattern 276a disposed in the center portion of the sub-pixel row. Further, since the moving speed of the solution becomes faster as the slope of the inclined surface gets larger, the moving speed of the solution around the third and fifth control patterns 276c and 276e having the largest slope of the inclined surface is faster than the moving speed of the solution around the second and fourth control patterns 276b and 276d having the relatively small slope of the inclined surface.

Therefore, the solution moves with a gradually decreased speed from the center portion of the sub-pixel row to the end portion of the sub-pixel row.

Accordingly, the light-emitting layer having a more uniform thickness can be formed at the center portion and the end portion of the sub-pixel row.

Here, the first bank 172 may be omitted.

The first, second, third, fourth and fifth control patterns 276a, 276b, 276c, 276d and 276e according to the second aspect of the present disclosure may be applied in a case where the height of the light-emitting layer increases from the end portion of the sub-pixel row to the center portion of the sub-pixel.

<Third Aspect>

Figure 14:
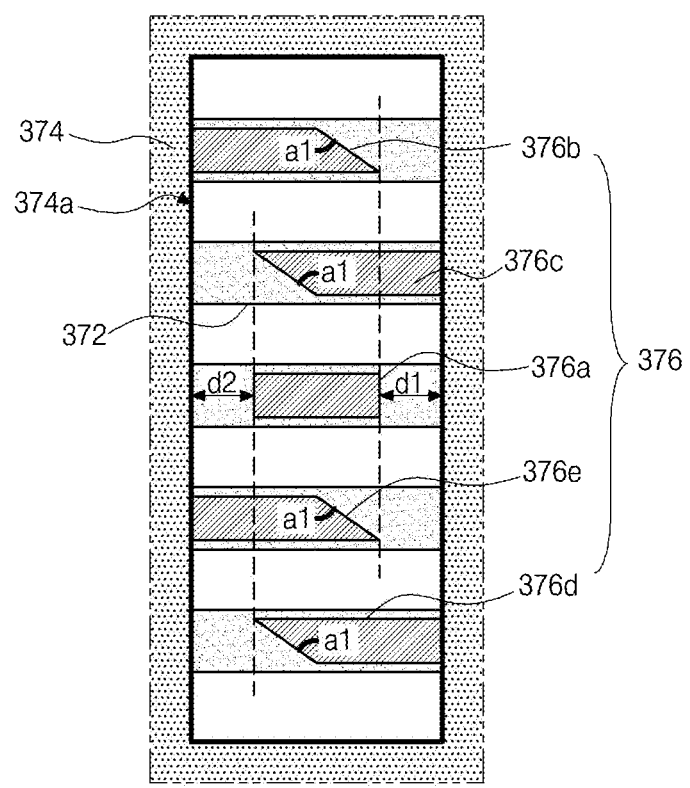
FIG. 14 is a plan view schematically illustrating a bank structure of an electroluminescent display device according to a third aspect of the present disclosure.

FIG. 14 is a plan view schematically illustrating a bank structure of an electroluminescent display device according to a third aspect of the present disclosure. The electroluminescent display device of the third aspect has the same structure as that of the first aspect except for a control pattern. The same parts will be designated by the same references, and descriptions of the same parts will be omitted or will be brief.

In FIG. 14, a first bank 172 extends along a first direction and is disposed between adjacent same color sub-pixels, and a second bank 174 is formed to have an opening 174a corresponding to a same color sub-pixel row.

In addition, a control pattern 376, which is a third bank, is formed between adjacent same color sub-pixels. The control pattern 376 is disposed on the first bank 172 and overlaps the first bank 172.

The control pattern 376 includes first, second, third, fourth and fifth control patterns 376a, 376b, 376c, 376d and 376e. The first control pattern 376a is disposed at a center portion of the same color sub-pixel row, the second control pattern 376b is spaced apart from the first control pattern 376a along a second direction, and the third control pattern 376c is disposed between the first control pattern 376a and the second control pattern 376b. Further, the fourth control pattern 376d is spaced apart from the first control pattern 376a on the opposite side of the second control pattern 376b along the second direction, and the fifth control pattern 376e is disposed between the first control pattern 376a and the fourth control pattern 376d. The first control pattern 376a is disposed between the third control pattern 376c and the fifth control pattern 376e.

At least one end of each of the first, second, third, fourth and fifth control patterns 376a, 376b, 376c, 376d and 376e is spaced apart from the second bank 174, and thus the first bank 172 thereunder is exposed between the second bank 174 and the at least one end of each of the first, second, third, fourth and fifth control patterns 376a, 376b, 376c, 376d and 376e. In addition, the at least one end of each of the first, second, third, fourth and fifth control patterns 376a, 376b, 376c, 376d and 376e, which is spaced apart from the second bank 174, has an inclined surface.

Namely, first and second ends of the first control pattern 376a are spaced apart from the second bank 174 by first and second distances d1 and d2, respectively. First ends of the second and fifth control patterns 376b and 376e are spaced apart from the second bank 174 by the first distance d1, and second ends of the second and fifth control patterns 376b and 376e are in contact with the second bank 174. First ends of the third and fourth control patterns 376c and 376d are in contact with the second bank 174, and second ends of the third and fourth control patterns 376c and 376d are spaced apart from the second bank 174 by the second distance d1. At this time, each of the first and second distances d1 and d2 may be about ¼ of a width of the opening 174a, i.e., about ¼ of a width of each sub-pixel along the first direction.

Here, the first end of each of the second and fifth control patterns 376b and 376e has an inclined surface, and the second end of each of the third and fourth control patterns 376c and 376d has an inclined surface. At this time, the inclined surfaces of the second, third, fourth and fifth control patterns 376b, 376c, 376d and 376e may have the same inclination angle a1. Accordingly, the inclined surfaces of the second, third, fourth and fifth control patterns 376b, 376c, 376d and 376e may have the same slope.

Alternatively, the inclination angle of the inclined surface of the second control pattern 376b may be different from the inclination angle of the inclined surface of the third control pattern 376c, and the inclination angle of the inclined surface of the fourth control pattern 376d may be different from the inclination angle of the inclined surface of the fifth control pattern 376e.

Meanwhile, each of the first and second ends of the first control pattern 376a has a substantially inclined surfaces with an inclination angle of 0 with respect to a line parallel to the second direction, and a slope of the inclined surface thereof is also 0.

The inclined surfaces of the second and third control patterns 376b and 376c face opposite sides, respectively, and the inclined surfaces of the fourth and fifth control patterns 376d and 376e also face opposite sides, respectively. That is, the inclined surfaces of the third and fifth control patterns 376c and 376e face the first control pattern 376a, and the inclined surfaces of the second and fourth control patterns 376b and 376d face the opposite side of the first control pattern 376a.

The inclined surfaces of the first, second, third, fourth and fifth control patterns 376a, 376b, 376c, 376d and 376e adjust a moving speed and moving direction of a solution. At this time, the solution moves from the side which the inclined surface faces to the opposite side thereto, and the moving speed of the solution becomes faster as the slope of the inclined surface gets larger.

Since the inclined surfaces of the second and third control patterns 376b and 376c face the opposite sides, the solution moves from the opposite sides of the second and third control patterns 376b and 376c, that is, an end portion and a center portion of the sub-pixel row to a portion between the second and third control patterns 376b and 376c. In addition, since the inclined surfaces of the fourth and fifth control patterns 376d and 376e face the opposite sides, the solution moves from the opposite sides of the fourth and fifth control patterns 376d and 376e, that is, another end portion and the center portion of the sub-pixel row to a portion between the fourth and fifth control patterns 376d and 376e. Here, the moving speed of the solution may be substantially the same around the second, third, fourth and fifth control patterns 376b, 376c, 376d and 376e because the inclined surfaces of the second, third, fourth and fifth control patterns 376b, 376c, 376d and 376e have the same slope.

Accordingly, the light-emitting layer having a more uniform thickness can be formed at the center portion and the end portion of the sub-pixel row.

Here, the first bank 172 may be omitted.

The first, second, third, fourth and fifth control patterns 376a, 376b, 376c, 376d and 376e according to the third aspect of the present disclosure may be applied in a case where the height of the light-emitting layer has a W-like shape in the sub-pixel row along the second direction.

<Fourth Aspect>

Figure 15:
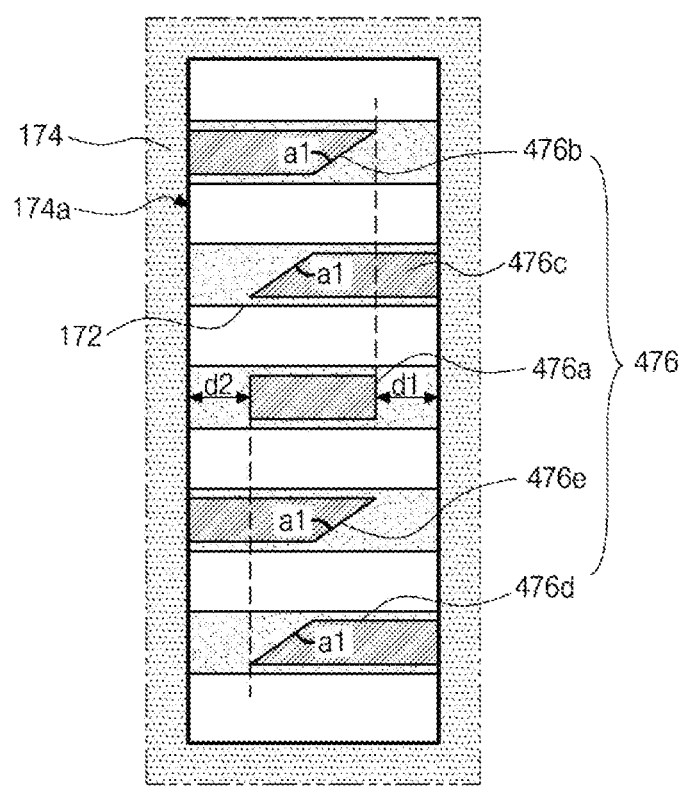
FIG. 15 is a plan view schematically illustrating a bank structure of an electroluminescent display device according to a fourth aspect of the present disclosure.

FIG. 15 is a plan view schematically illustrating a bank structure of an electroluminescent display device according to a fourth aspect of the present disclosure. The electroluminescent display device of the fourth aspect has the same structure as that of the first aspect except for a control pattern. The same parts will be designated by the same references, and descriptions of the same parts will be omitted or will be brief.

In FIG. 15, a first bank 172 extends along a first direction and is disposed between adjacent same color sub-pixels, and a second bank 174 is formed to have an opening 174a corresponding to a same color sub-pixel row.

In addition, a control pattern 476, which is a third bank, is formed between adjacent same color sub-pixels. The control pattern 476 is disposed on the first bank 172 and overlaps the first bank 172.

The control pattern 476 includes first, second, third, fourth and fifth control patterns 476a, 476b, 476c, 476d and 476e. The first control pattern 476a is disposed at a center portion of the same color sub-pixel row, the second control pattern 476b is spaced apart from the first control pattern 476a along a second direction, and the third control pattern 476c is disposed between the first control pattern 476a and the second control pattern 476b. Further, the fourth control pattern 476d is spaced apart from the first control pattern 476a on the opposite side of the second control pattern 476b along the second direction, and the fifth control pattern 476e is disposed between the first control pattern 476a and the fourth control pattern 476d. The first control pattern 476a is disposed between the third control pattern 476c and the fifth control pattern 476e.

At least one end of each of the first, second, third, fourth and fifth control patterns 476a, 476b, 476c, 476d and 476e is spaced apart from the second bank 174, and thus the first bank 172 thereunder is exposed between the second bank 174 and the at least one end of each of the first, second, third, fourth and fifth control patterns 476a, 476b, 476c, 476d and 476e. In addition, the at least one end of each of the first, second, third, fourth and fifth control patterns 476a, 476b, 476c, 476d and 476e, which is spaced apart from the second bank 174, has an inclined surface.

Namely, first and second ends of the first control pattern 476a are spaced apart from the second bank 174 by first and second distances d1 and d2, respectively. First ends of the second and fifth control patterns 476b and 476e are spaced apart from the second bank 174 by the first distance d1, and second ends of the second and fifth control patterns 476b and 476e are in contact with the second bank 174. First ends of the third and fourth control patterns 476c and 476d are in contact with the second bank 174, and second ends of the third and fourth control patterns 476c and 476d are spaced apart from the second bank 174 by the second distance d1. At this time, each of the first and second distances d1 and d2 may be about ¼ of a width of the opening 174a, i.e., about ¼ of a width of each sub-pixel along the first direction.

Here, the first end of each of the second and fifth control patterns 476b and 476e has an inclined surface, and the second end of each of the third and fourth control patterns 476c and 476d has an inclined surface. At this time, the inclined surfaces of the second, third, fourth and fifth control patterns 476b, 476c, 476d and 476e may have the same inclination angle a1. Accordingly, the inclined surfaces of the second, third, fourth and fifth control patterns 476b, 476c, 476d and 476e may have the same slope.

Alternatively, the inclination angle of the inclined surface of the second control pattern 476b may be different from the inclination angle of the inclined surface of the third control pattern 476c, and the inclination angle of the inclined surface of the fourth control pattern 476d may be different from the inclination angle of the inclined surface of the fifth control pattern 476e.

Meanwhile, each of the first and second ends of the first control pattern 476a has a substantially inclined surfaces with an inclination angle of 0 with respect to a line parallel to the second direction, and a slope of the inclined surface thereof is also 0.

The inclined surfaces of the second and third control patterns 476b and 476c face each other, and the inclined surfaces of the fourth and fifth control patterns 476d and 476e also face each other. That is, the inclined surfaces of the third and fifth control patterns 476c and 476e face the opposite side of the first control pattern 476a, and the inclined surfaces of the second and fourth control patterns 476b and 476d face the first control pattern 476a.

The inclined surfaces of the first, second, third, fourth and fifth control patterns 476a, 476b, 476c, 476d and 476e adjust a moving speed and moving direction of a solution. At this time, the solution moves from the side which the inclined surface faces to the opposite side thereto, and the moving speed of the solution becomes faster as the slope of the inclined surface gets larger.

Since the inclined surfaces of the second and third control patterns 476b and 476c face each other, the solution moves from a portion between the second and third control patterns 476b and 476c to opposite sides of the second and third control patterns 476b and 476c, that is, an end portion and a center portion of the sub-pixel row. In addition, since the inclined surfaces of the fourth and fifth control patterns 476d and 476e face each other, the solution moves from a portion between the fourth and fifth control patterns 476d and 476e to opposite sides of the fourth and fifth control patterns 476d and 476e, that is, another end portion and the center portion of the sub-pixel row. Here, the moving speed of the solution may be substantially the same around the second, third, fourth and fifth control patterns 476b, 476c, 476d and 476e because the inclined surfaces of the second, third, fourth and fifth control patterns 476b, 476c, 476d and 476e have the same slope.

Accordingly, the light-emitting layer having a more uniform thickness can be formed at the center portion and the end portion of the sub-pixel row.

Here, the first bank 172 may be omitted.

The first, second, third, fourth and fifth control patterns 476a, 476b, 476c, 476d and 476e according to the fourth aspect of the present disclosure may be applied in a case where the height of the light-emitting layer has an M-like shape in the sub-pixel row along the second direction.

In the present disclosure, by forming the light-emitting layer of each sub-pixel through the solution process, a mask is omitted to thereby reduce the manufacturing costs, and a display device with a large size and high definition can be implemented.

Moreover, the light-emitting layers of the same color sub-pixels are connected to each other and formed as one body, thereby minimizing the deviation in the dropping amount between nozzles and uniformly forming the thicknesses of the light-emitting layers of the sub-pixels. Therefore, the mura is prevented, thereby effectively preventing the image quality of the display device from being lowered.

Further, the hydrophilic control pattern is formed between adjacent same color sub-pixels, and the moving speed and moving direction of the solution are controlled, thereby forming the light-emitting layer having the more uniform thickness at each sub-pixel.

It will be apparent to those skilled in the art that various modifications and variations can be made in a display device of the present disclosure without departing from the sprit or scope of the aspects. Thus, it is intended that the present disclosure covers the modifications and variations of this disclosure provided they come within the scope of the appended claims and their equivalents.

What is claimed is:

1. An electroluminescent display device comprising:
a substrate;
a plurality of sub-pixels arranged on the substrate, including sub-pixels with different colors arranged along a first direction and sub-pixels with a same color arranged along a second direction;
a light-emitting diode disposed at each sub-pixel and including a first electrode, a light-emitting layer and a second electrode;
a bank having an opening corresponding to a sub-pixel row along the second direction and disposed between two adjacent sub-pixels along the first direction; and
a control pattern between two adjacent sub-pixels along the second direction,
wherein the control pattern includes a first control pattern corresponding to a center portion of the sub-pixel row and a second control pattern spaced apart from the first control pattern along the second direction, and
where a first end of each of the first and second control patterns is spaced apart from the bank and has an first surface parallel to or inclined with respect to the second direction, and a slope of the first surface of the second control pattern is larger than a slope of the first surface of the first control pattern.

2. The electroluminescent display device of claim 1, wherein the control pattern further includes a third control pattern between the first and second control patterns, and
wherein a first end of the third control pattern is spaced apart from the bank and has a first surface inclined with respect to the second direction, and a slope of the first surface of the third control pattern is different from the slope of the first surface of the second control pattern.

3. The electroluminescent display device of claim 2, wherein a direction which the first surfaces of the second and third control patterns face is opposite to a direction of the first control pattern with respect to the second and third control patterns, and the slope of the first surface of the third control pattern is smaller than the slope of the first surface of the second control pattern and larger than the slope of the first surface of the first control pattern.

4. The electroluminescent display device of claim 2, wherein the first surfaces of the second and third control patterns face the first control pattern, and the slope of the first surface of the second control pattern is smaller than the slope of the first surface of the third control pattern and larger than the slope of the first surface of the first control pattern.

5. The electroluminescent display device of claim 1, wherein the control pattern further includes a third control pattern between the first and second control patterns, and
wherein a first end of the third control pattern is in contact with the bank, and a second end of the third control pattern is spaced apart from the bank and has a first surface inclined with respect to the second direction.

6. The electroluminescent display device of claim 5, wherein a slope of the first surface of the third control pattern is a same as the slope of the first surface of the second control pattern, and the first surface of the second and third control patterns face opposite sides.

7. The electroluminescent display device of claim 5, wherein a slope of the first surface of the third control pattern is a same as the slope of the first surface of the second control pattern, and the first surfaces of the second and third control patterns face each other.

8. The electroluminescent display device of claim 1, wherein the bank has a hydrophobic property and the control pattern has a hydrophilic property.

9. The electroluminescent display device of claim 8, further comprising a hydrophilic bank under the control pattern between adjacent sub-pixels along the second direction.

10. The electroluminescent display device of claim 8, wherein control patterns corresponding to adjacent sub-pixels along the first direction have different heights.

11. The electroluminescent display device of claim 9, wherein the hydrophilic bank is formed with a material different from that of the control pattern.

12. The electroluminescent display device of claim 1, wherein the emitting layer has a higher height in an edge portion of the opening of the bank than in a center portion of the opening.

13. The electroluminescent display device of claim 1, wherein the bank is formed through a half-tone mask process.

14. An electroluminescent display device comprising:
a substrate;
a plurality of sub-pixels arranged on the substrate, including sub-pixels with different colors arranged along a first direction and sub-pixels with a same color arranged along a second direction;
a light-emitting diode disposed at each sub-pixel and including a first electrode, a light-emitting layer and a second electrode;
a first bank disposed between two adjacent sub-pixels along the first direction;
a second bank disposed on the first bank and having a height greater than of the first bank; and
a control pattern disposed between two adjacent sub-pixels along the second direction and including a first control pattern corresponding to a center portion of the sub-pixel row and a second control pattern spaced apart from the first control pattern along the second direction, where a first end of each of the first and second control patterns is spaced apart from the second bank and has an first surface parallel to or inclined with respect to the second direction, and a slope of the first surface of the second control pattern is larger than a slope of the first surface of the first control pattern.

15. The electroluminescent display device of claim 14, wherein the control pattern further includes a third control pattern between the first and second control patterns, and
wherein a first end of the third control pattern is spaced apart from the second bank and has a first surface inclined with respect to the second direction, and a slope of the first surface of the third control pattern is different from the slope of the first surface of the second control pattern.

16. The electroluminescent display device of claim 15, wherein a direction which the first surfaces of the second and third control patterns face is opposite to a direction of the first control pattern with respect to the second and third control patterns, and the slope of the first surface of the third control pattern is smaller than the slope of the first surface of the second control pattern and larger than the slope of the first surface of the first control pattern.

17. The electroluminescent display device of claim 15, wherein the first surfaces of the second and third control patterns face the first control pattern, and the slope of the first surface of the second control pattern is smaller than the slope of the first surface of the third control pattern and larger than the slope of the first surface of the first control pattern.

18. The electroluminescent display device of claim 14, wherein the control pattern further includes a third control pattern between the first and second control patterns, and
wherein a first end of the third control pattern is in contact with the bank, and a second end of the third control pattern is spaced apart from the bank and has a first surface inclined with respect to the second direction.

19. The electroluminescent display device of claim 18, wherein a slope of the first surface of the third control pattern is a same as the slope of the first surface of the second control pattern, and the first surface of the second and third control patterns face opposite sides.

20. The electroluminescent display device of claim 18, wherein a slope of the first surface of the third control pattern is a same as the slope of the first surface of the second control pattern, and the first surfaces of the second and third control patterns face each other.

* * * * *